US010534025B2

(12) United States Patent
Zhuang

(10) Patent No.: US 10,534,025 B2
(45) Date of Patent: Jan. 14, 2020

(54) PHASE FREQUENCY DETECTOR LINEARIZATION USING SWITCHING SUPPLY

(71) Applicant: QUALCOMM Incorporated, San Diego, CA (US)

(72) Inventor: Jingcheng Zhuang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 74 days.

(21) Appl. No.: 15/710,593

(22) Filed: Sep. 20, 2017

(65) Prior Publication Data

US 2018/0356451 A1 Dec. 13, 2018

Related U.S. Application Data

(60) Provisional application No. 62/518,405, filed on Jun. 12, 2017.

(51) Int. Cl.
*G01R 23/02* (2006.01)
*G01R 25/00* (2006.01)
*H03L 7/089* (2006.01)

(52) U.S. Cl.
CPC ............. *G01R 23/02* (2013.01); *G01R 25/00* (2013.01); *H03L 7/089* (2013.01)

(58) Field of Classification Search
CPC ................................ G01R 31/01; G01R 31/04
See application file for complete search history.

(56) References Cited

U.S. PATENT DOCUMENTS 5,841,324 A 11/1998 Williams
6,771,096 B1 8/2004 Meyers
6,806,742 B1 * 10/2004 Briones .................. G01R 25/00 327/10
8,179,163 B2 5/2012 Yu
2002/0136342 A1 * 9/2002 Lee ......................... H03L 7/087 375/376
2007/0252620 A1 * 11/2007 Gailus .................... H03D 13/00 327/3
2008/0111646 A1 * 5/2008 Nair .......................... H03L 7/08 331/185

(Continued)

OTHER PUBLICATIONS

Bietti I., et al., "An UMTS ΣΔ Fractional Synthesizer with 200kHz Bandwidth and −128dBc/Hz @ 1MHzusing Spurs Compensation and Linearization Techniques", IEEE Custom Integrated Circuits Conference, Dec. 2003, pp. 463-466.

(Continued)

*Primary Examiner* — Dominic E Hawkins
(74) *Attorney, Agent, or Firm* — Qualcomm Incorporated/Seyfarth Shaw LLP

(57) ABSTRACT

A phase frequency detector (PFD) isolates supply (e.g., voltage supply) to a reference path and a feedback path of a phase locked loop (PLL) such that the power supply to the reference path is independent of the power supply to the feedback path. This isolation improves linearity. In one instance, the PFD includes a supply voltage, one or more switches, a reference capacitor and a feedback capacitor. The reference capacitor is selectively coupled to the supply voltage via the one or more switches and the feedback capacitor is selectively coupled to the supply voltage via the one or more switches.

20 Claims, 7 Drawing Sheets

(56) References Cited

U.S. PATENT DOCUMENTS

| | | | | |
|---|---|---|---|---|
| 2015/0346244 | A1* | 12/2015 | Yu | H03L 7/099 702/65 |
| 2016/0329902 | A1 | 11/2016 | J. et al. | |

OTHER PUBLICATIONS

Ti C-L., et al., "A 2.4-GHz Fractional-N PLL with a PFD/CP Linearization and an Improved CP Circuit", IEEE International Symposium on Circuits and Systems, Jun. 2008, pp. 1728-1731.

International Search Report and Written Opinion—PCT/US2018/031412—ISA/EPO—dated Jul. 26, 2018.

* cited by examiner

PHASE FREQUENCY DETECTOR LINEARIZATION USING SWITCHING SUPPLY

CROSS-REFERENCE TO RELATED APPLICATION

The present application claims the benefit of U.S. Provisional Patent Application No. 62/518,405, filed on Jun. 12, 2017, and titled "PHASE FREQUENCY DETECTOR LINEARIZATION USING SWITCHING SUPPLY," the disclosure of which is expressly incorporated by reference herein in its entirety.

TECHNICAL FIELD

The present disclosure generally relates to phase frequency detectors. More specifically, the present disclosure relates to phase frequency detector linearization using a switching supply.

BACKGROUND

Mobile radio frequency (RF) chip designs (e.g., mobile RF transceivers) have migrated to deep sub-micron process nodes due to cost and power consumption considerations. The design complexity of mobile RF transceivers is further complicated by added circuit function to support communication enhancements. Further design challenges for mobile RF transceivers include analog/RF performance considerations, including mismatch, noise, and other performance considerations. The design of these mobile RF chips include the use of a phase locked loop (PLL), for example, to generate an output signal with a phase related to a phase of an input signal.

The PLL is a closed-loop frequency-control system based on a phase difference between the input clock signal and a feedback clock signal of a controlled oscillator. The main blocks of the PLL are the phase frequency detector (PFD), charge pump, loop filter, voltage controlled oscillator (VCO), and counters, such as a feedback counter (M), a pre-scale counter (N), and post-scale counters (C).

In phase locked loop (PLL) structures, particularly in frequency synthesizers (FS), a phase frequency detector (PFD) is often used instead of the conventional phase detector (PD). Compared with the PD, the PFD has both phase and the frequency sensitivity and an input range up to $+/-2\pi$, which enables increasing of the acquisition range and locking speed of the tracking system.

In practice, some issues arise with implementation of the PFD, such as non-linearity of the dynamic transfer characteristic (TC) and direct current (DC) offset of the output signal. Mainly, the non-linearity is caused by the finite speed (time delays) of the components used (dynamic errors) as well as by tolerances and mismatching of the component parameters (static errors).

SUMMARY

A phase frequency detector may include a supply voltage and one or more switches. The phase frequency detector also includes a reference capacitor selectively coupled to the supply voltage via the one or more switches. The phase frequency detector further includes a feedback capacitor selectively coupled to the supply voltage via the one or more switches.

A method for linearizing a phase frequency detector of a phase locked loop may include generating a first UP action signal or a first DOWN action signal from a feedback capacitor selectively coupled to a supply voltage via one or more switches to a feedback domain of the phase frequency detector. The method further includes generating a second DOWN action signal or a second UP action signal from a reference capacitor selectively coupled to the supply voltage via the one or more switches to a reference domain of the phase frequency detector.

A phase frequency detector may include means for supplying voltage and means for selectively coupling a supplied voltage. The phase frequency detector also includes a reference capacitor selectively coupled to the voltage supplying means via the coupling means. The phase frequency detector further includes a feedback capacitor selectively coupled to the voltage supplying means via the coupling means.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
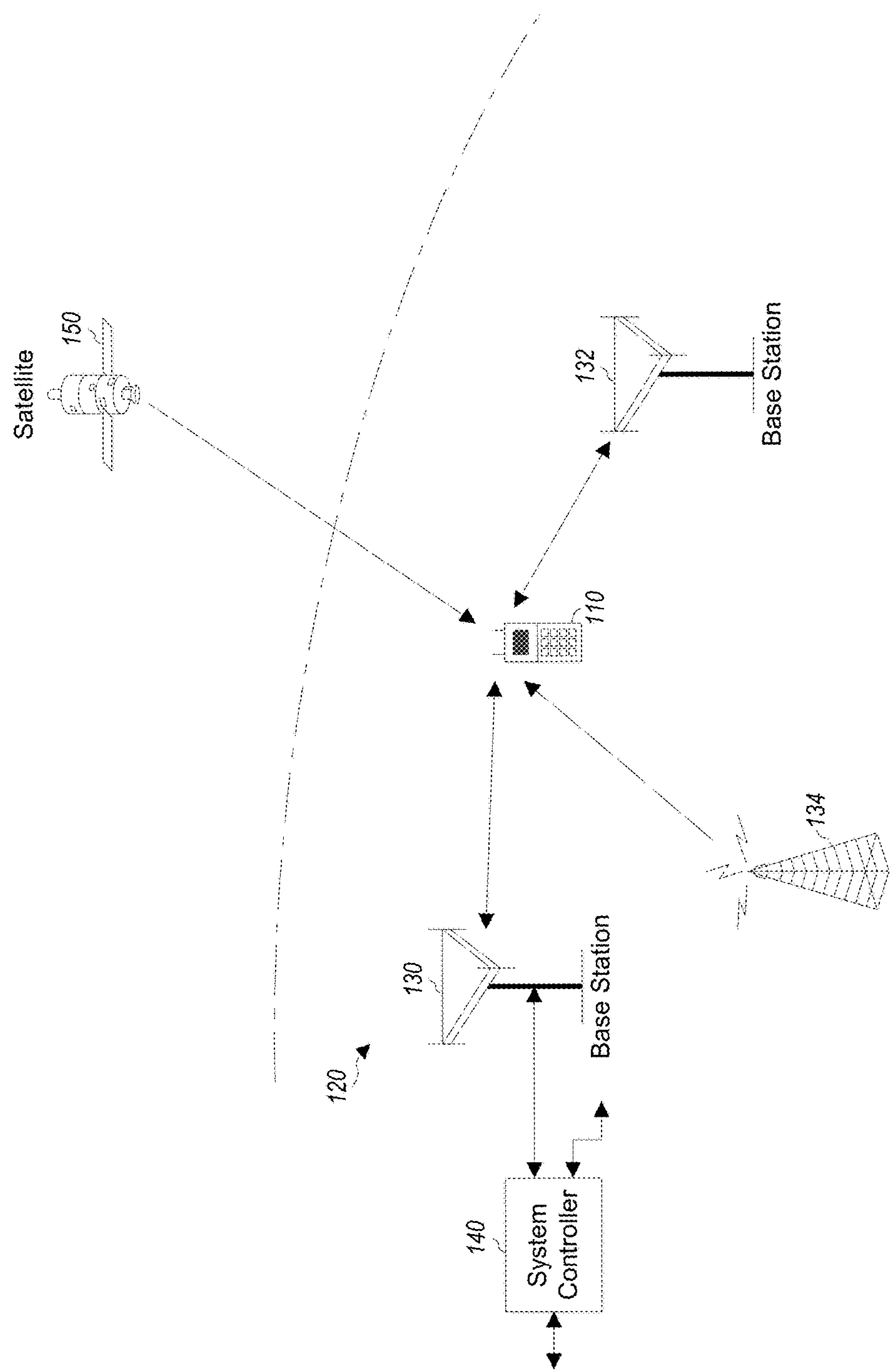
FIG. 1 shows a wireless device communicating with a wireless communication system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

A phase locked loop (PLL) circuit is often an important component of a device that is designed to operate in a wireless communication system. The PLL forces an oscillator of the PLL circuit (e.g., a voltage controlled oscillator (VCO), digital controlled oscillator, temperature controlled oscillator, or the like) to replicate and track a reference frequency and phase at an input when the PLL is in lock configuration. When locked, the frequencies of the input (e.g., at a phase detector) and output (e.g., at a VCO) are tracked exactly (e.g., input frequency=output frequency). A phase offset, however, may exist between the input and output.

A PLL reference frequency may be derived from a local oscillator (e.g., crystal oscillator, (XO)). For example, a frequency of the crystal oscillator may be around tens of megahertz (MHz) while a frequency of the VCO may be specified to generate a periodic signal in the GHz range. In this case, a frequency divider by N is interposed between the VCO and the phase detector. When locked, the frequency at an output of the PLL (e.g., at a VCO) tracks exactly at N times the frequency at an input of the PLL (e.g., at a phase detector). For example, N*input frequency is equal to the output frequency. Thus, the output frequency of the VCO is set at a fractional multiple of the frequency by the frequency divider.

A phase frequency detector (PFD) of the PLL detects the difference in phase and frequency between reference signal inputs and feedback signal inputs and generates an "UP" or "DOWN" control signal based on whether the feedback signal is lagging or leading the reference signal. These "UP" or "DOWN" control signals determine whether the VCO operates at a higher or lower frequency, respectively. The PFD outputs these "UP" and "DOWN" signals to a charge pump. If the charge pump receives an UP signal, current is driven into the loop filter. Conversely, if it receives a DOWN signal, current is drawn from the loop filter. For example, the PFD includes a logic control unit with two input signals from a reference clock and a feed clock and output signals, Vup and Vdn, respectively, and a charge pump (CP) controlled by the control unit. The charge pump generates output current pulses.

The loop filter converts these signals to a control voltage that is used to bias the VCO. Based on the control voltage, the VCO oscillates at a higher or lower frequency, which affects the phase and frequency of the feedback signal. If the PFD produces an UP signal, then the VCO frequency increases. A DOWN signal decreases the VCO frequency. The VCO stabilizes once the reference signal and the feedback signal have the same phase and frequency. The loop filter filters out jitter by removing glitches from the charge pump and preventing voltage over-shoot. When the reference signal and the feedback signal are aligned, the PLL is considered locked.

In practice, some issues arise when implementing the PFD, such as non-linearity of the dynamic transfer characteristic (TC) and DC offset of the output signal. The linearity of the PFD affects both noise and spur performance of the PLL. A main contributor of the PFD non-linear behavior is a supply coupling between a reference path corresponding to the reference signal and a feedback path corresponding to the feedback signal.

One technique to mitigate non-linear behavior of the PFD is to add separate resistor-capacitor (RC) filters to supply a circuit associated with the reference path and the feedback path. However, the technique is subject to a complex balance where the RC corner frequency should be low enough to isolate the two paths, but high enough to ensure the supply voltage goes back to constant voltage before an arrival of a next clock edge.

Accordingly, new techniques for improving the non-linear behavior of the PFD are desirable.

Aspects of the present disclosure are directed to improving non-linear behavior of the phase frequency detector (PFD) as well as non-linear behavior of a charge pump (CP) and a buffer of the phase lock loop (PLL). In one aspect of the disclosure, a switching supply of a PFD isolates supply (e.g., voltage supply) to a reference path and a feedback path of the PLL such that the power supply to the reference path is independent of the power supply to the feedback path. This isolation improves linearity. The two paths are still coupled to a same power supply (e.g., low dropout (LDO) regulator) to receive a charge from the LDO regulator when a charge pump associated with the phase frequency detector is not charging.

The phase frequency detector may include a supply voltage, one or more switches, a reference capacitor and a feedback capacitor. The reference capacitor is selectively coupled to the supply voltage via the one or more switches, and the feedback capacitor is selectively coupled to the supply voltage via the one or more switches. In one aspect, a feedback domain triggers a DOWN (associated with a falling edge) action from charge stored in the feedback capacitor and a reference domain triggers an UP (associated with a rising edge) action from charge stored in the reference capacitor.

Accordingly, aspects of the present disclosure substantially maintain (or keep substantially constant) a time difference between the respective rising edges and their corresponding rising edge outputs of the reference clock and the feedback clock after being processed through the PFD.

Figure 8:
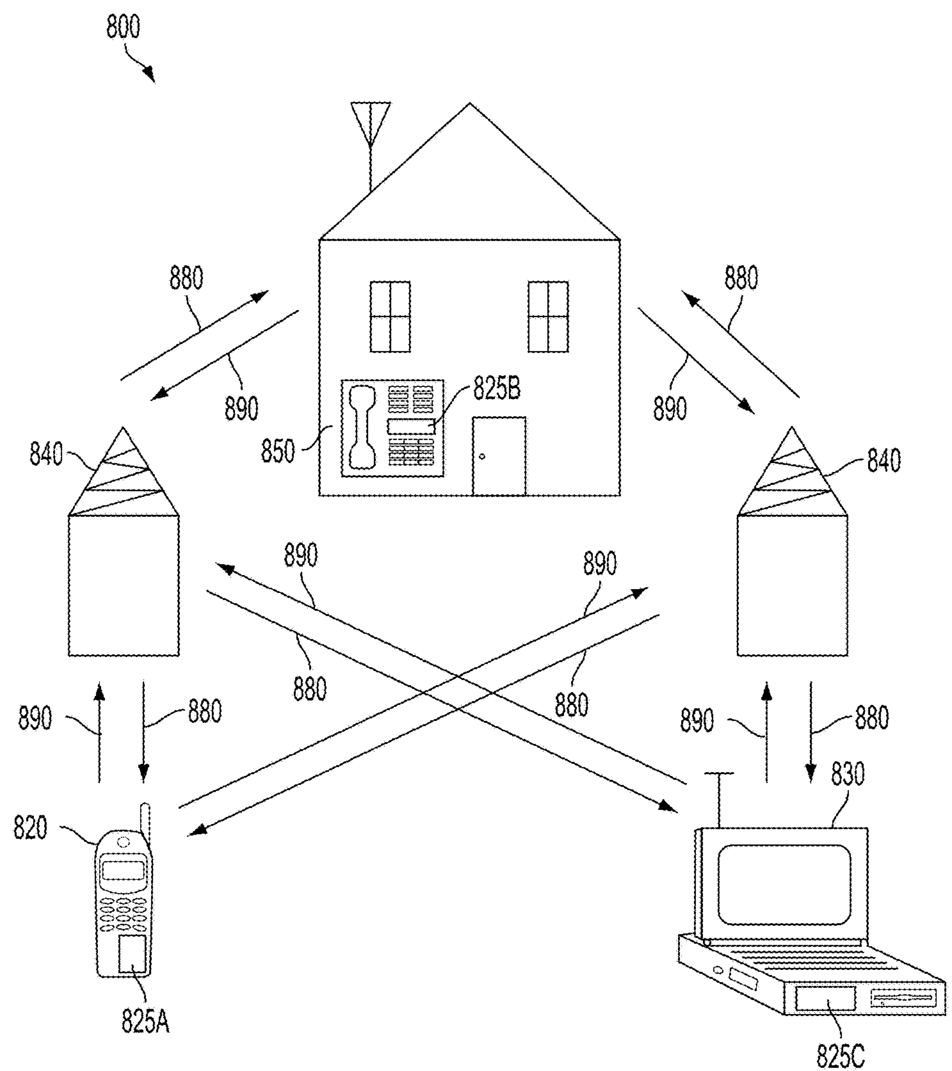
FIG. 8 is a block diagram showing an exemplary wireless communication system in which a configuration of the disclosure may be advantageously employed.

The aspects of the present disclosure may be implemented in the system of FIGS. 1 and 8. More specifically, aspects of the present disclosure may be implemented in the wireless device of FIG. 2 and/or in the PLL of FIG. 3.

FIG. 1 shows a wireless device 110 communicating with a wireless communication system 120. The wireless communication system 120 may be a 5G system, a long-term evolution (LTE) system, a code division multiple access (CDMA) system, a global system for mobile communications (GSM) system, a wireless local area network (WLAN) system, millimeter wave (mmW) technology, or some other wireless system. A CDMA system may implement wideband CDMA (WCDMA), time division synchronous CDMA (TD-SCDMA), CDMA2000, or some other version of CDMA. In a millimeter wave (mmW) system, multiple antennas are used for beamforming (e.g., in the range of 30 GHz, 60 GHz, etc.). For simplicity, FIG. 1 shows the wireless communication system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to 5 carriers in one or two bands in LTE Release 11.

Figure 2:
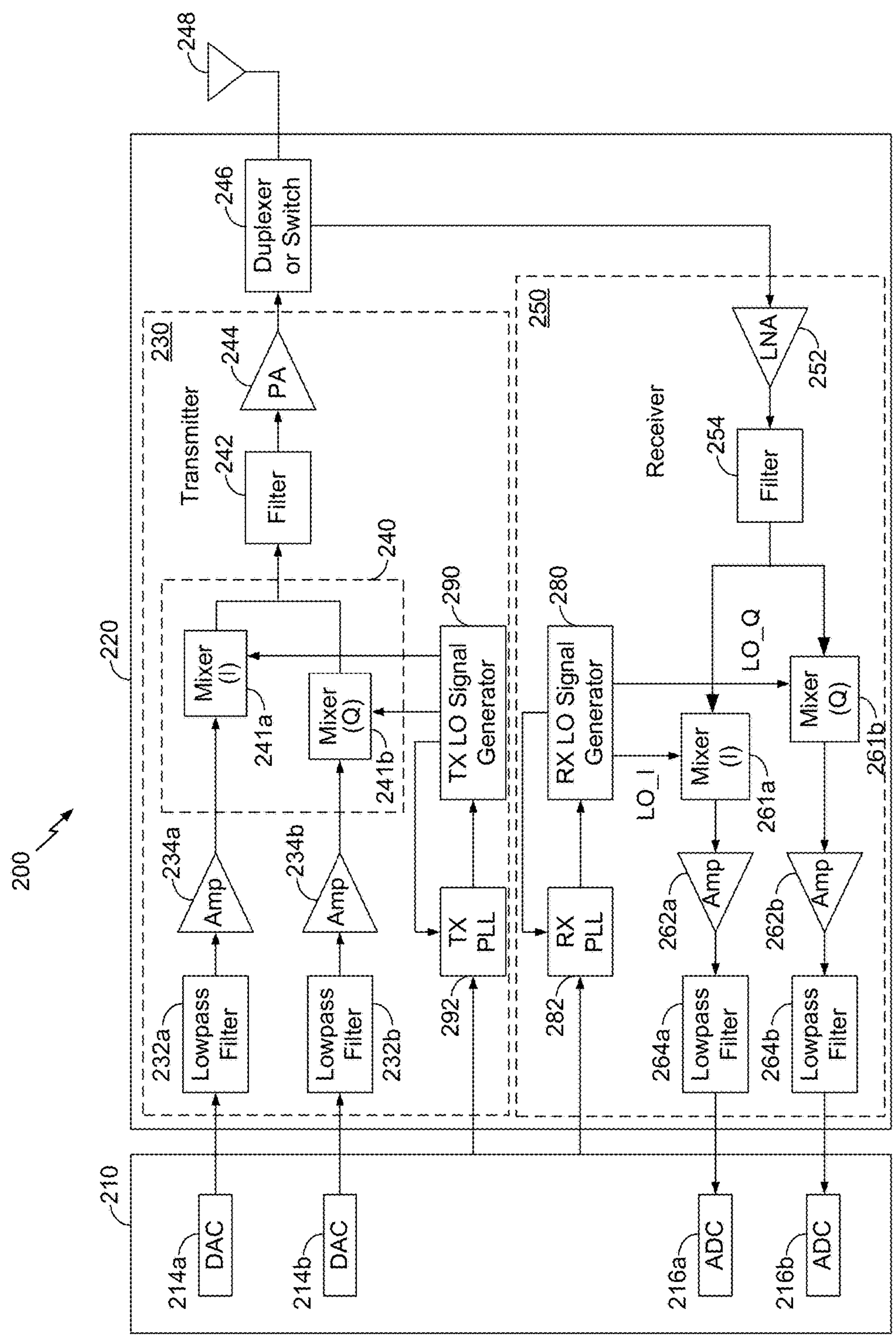
FIG. 2 shows a block diagram of the wireless device in FIG. 1, according to an aspect of the present disclosure.

FIG. 2 shows a block diagram of an exemplary design of a wireless device 200, such as the wireless device 110 shown in FIG. 1. FIG. 2 shows an example of a transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other illustrations in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and from intermediate frequency to baseband in another stage for a receiver. In the direct-conversion architecture, a signal is frequency-converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog converters (DACs) 214*a* and 214*b* for converting digital signals generated by the data processor 210 into the in-phase (I) and quadrature (Q) analog output signals (e.g., I and Q output currents) for further processing.

Within the transmitter 230, lowpass filters 232*a* and 232*b* filter the in-phase (I) and quadrature (Q) analog transmit signals, respectively, to reduce undesired images caused by the prior digital-to-analog conversion. Amplifiers (Amp) 234*a* and 234*b* amplify the signals from lowpass filters 232*a* and 232*b*, respectively, and provide in-phase (I) and quadrature (Q) baseband signals. An upconverter 240 including upconversion mixers 241*a* and 241*b* upconverts the in-phase (I) and quadrature (Q) baseband signals with in-phase (I) and quadrature (Q) transmit (TX) local oscillator (LO) signals from a TX LO signal generator 290 to provide an upconverted signal. A filter 242 filters the upconverted signal to reduce undesired images caused by the frequency upconversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communication signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconversion mixers 261*a* and 261*b* mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262*a* and 262*b* and further filtered by lowpass filters 264*a* and 264*b* to obtain in-phase (I) and quadrature (Q) analog input signals, which are provided to the data processor 210. In the exemplary configuration shown, the data processor 210 includes analog-to-digital converters (ADCs) **216*a* and 216*b* for converting the analog input signals into digital signals for further processing by the data processor 210**.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

The wireless device 200 may support carrier aggregation and may (i) receive multiple downlink signals transmitted by one or more cells on multiple downlink carriers at different frequencies, and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

Figure 3:
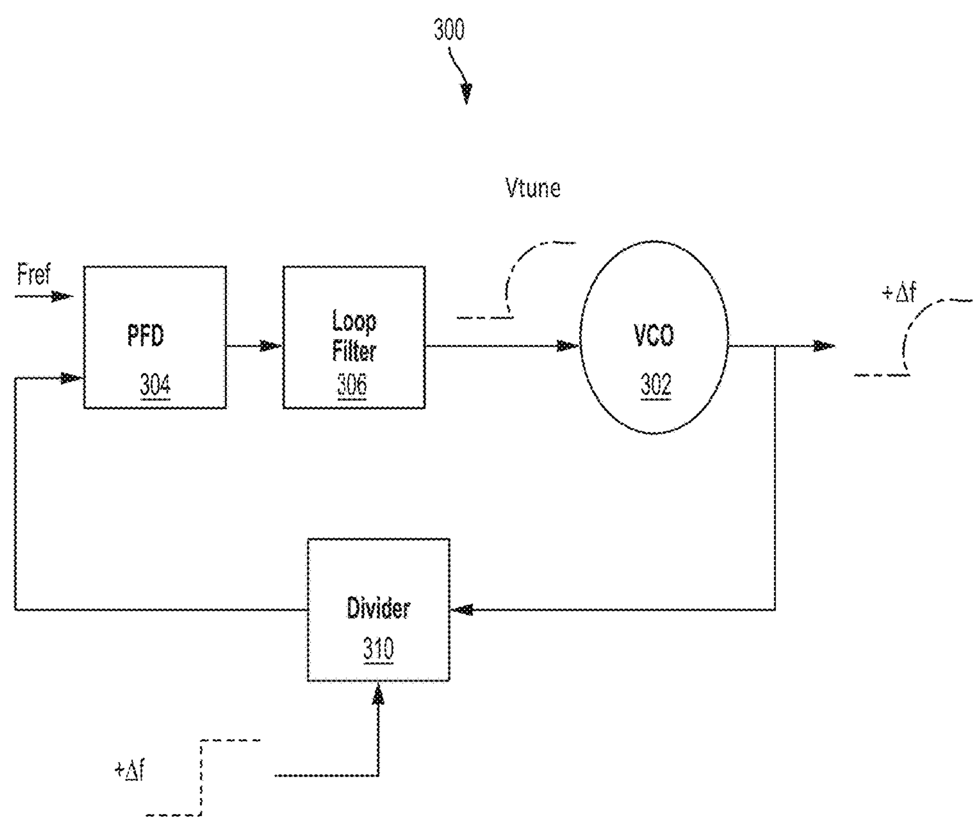
FIG. 3 illustrates a phase lock loop (PLL) system according to aspects of the present disclosure.

FIG. 3 illustrates a phase lock loop (PLL) system 300. The PLL system 300 includes a voltage controlled oscillator (VCO) 302, a phase frequency detector (PFD) 304, a loop filter (e.g., low pass filter) 306, and a frequency divider (e.g., integer-N synthesizer or fractional synthesizer) 310. The PLL system 300 may be integrated in a mobile communication device. For example, the PLL system 300 may be implemented in a radio frequency (RF) module of the mobile communication device.

The phase frequency detector 304 may be coupled to the loop filter 306, the loop filter 306 may be coupled to the VCO 302, the VCO 302 may be coupled to the frequency divider 310 and the frequency divider 310 may be coupled to the phase frequency detector 304 to close a feedback loop. The output of the VCO 302 may be a frequency sinusoid that is controlled by a tuning voltage Vtune, which is received by the VCO 302 from the loop filter 306. For example, changing the tuning voltage Vtune changes the frequency of the VCO 302. To synthesize a desirable or exact frequency of the VCO 302, the output frequency of the VCO 302 is fed back to the frequency divider 310. The phase frequency detector 304 compares an output of the frequency divider 310 with a reference signal (e.g., reference signal Fref). In some aspects, the reference frequency may be generated by a stable local crystal oscillator (not shown).

For example, if the reference frequency of the crystal oscillator is at 40 MHz and the output of the VCO 302 is at 4 GHz, the frequency divider 310 receives the 4 GHz output of the VCO 302. The frequency divider 310 is programmed to divide by 100 to provide an output frequency to the phase frequency detector 304 that matches the reference frequency received at the phase frequency detector 304. The phase frequency detector 304 compares a phase of the reference frequency and the output frequency of the frequency divider 310 and generates an error signal, proportional to a phase difference between the two frequencies. In some implementations, an analog multiplier or mixer can be used as the phase frequency detector 304. Because the reference frequency and the output from the frequency divider are the same when the loop is locked, the output of the phase frequency detector 304 contains a direct current (DC) component and a signal at twice the frequency (e.g., this is true when the phase frequency detector is in the form of a multiplier or mixer). The DC component is proportional to the phase difference. The double frequency component is removed by the loop filter 306. Any phase difference then shows up as a control voltage (e.g., tuning voltage (Vtune)) to the VCO 302 after filtering.

Figure 4A:
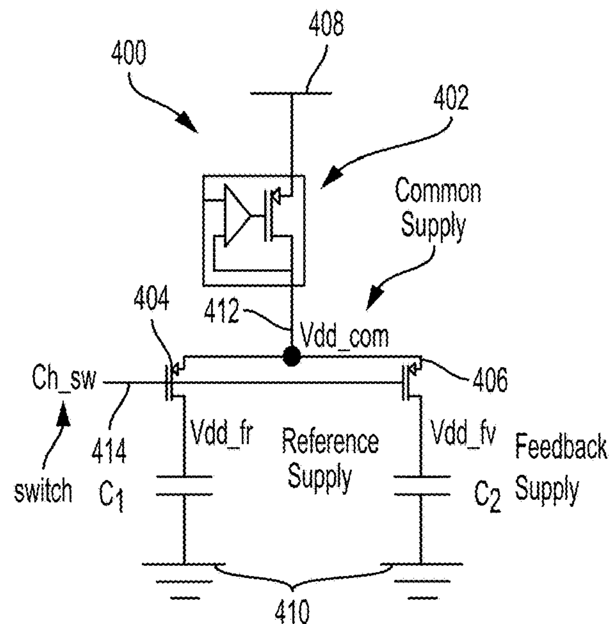
FIG. 4A illustrates a switching power supply for a phase frequency detector (PFD) device of a timing circuit (e.g., phase locked loop) according to aspects of the present disclosure.

FIG. 4A illustrates a switching power supply 400 for a phase frequency detector (PFD) device of a timing circuit (e.g., phase locked loop), according to aspects of the present disclosure. The switching power supply 400 includes a power supply device 402 (e.g., low dropout (LDO) regulator), a first switch 404, a second switch 406, a reference capacitor C1 and a feedback capacitor C2. In one aspect, the first switch 404 and the second switch 406 may be transistors that are controlled by a control signal 414. For example, the switch includes a first transistor coupled between the reference capacitor C1 and a common node 412 (that sees a supply voltage from the LDO regulator) and a second transistor coupled between the feedback capacitor C2 and the common node 412.

The reference capacitor C1 is coupled between the first switch 404 and a ground 410. The feedback capacitor C2 is coupled between the second switch 406 and the ground 410. The switching power supply 400 provides power to the PFD in accordance with a split supply from the reference capacitor C1 and the feedback capacitor C2. The reference capacitor C1 provides a reference supply Vdd_fr to a reference domain of the PFD. The feedback capacitor C2 provides a feedback supply Vdd_fv to a feedback domain of the PFD. The first switch 404 is coupled between the common node 412 and the reference capacitor C1 and the second switch 406 is coupled between the common node 412 and the feedback capacitor C2. The power supply device 402 is coupled between a power supply source 408 and the common node 412. The power supply device 402 provides a supply voltage Vdd_com to charge the reference capacitor C1 and the feedback capacitor C2.

The switching power supply 400 for the PFD device (e.g., PFD 304) isolates supply (e.g., voltage supply) to a reference path and a feedback path of the PLL such that the power supply to the reference path is independent of the power supply to the feedback path. The reference path includes the first switch 404 and the reference capacitor C1 such that the reference capacitor C1 selectively supplies power to a reference domain (associated with the reference path) of the PFD. The feedback path includes the second switch 406 and the feedback capacitor C2 such that the feedback capacitor C2 selectively supplies power to a feedback domain (associated with the feedback path) of the PFD. The reference capacitor C1 and the feedback capacitor C2 are coupled to the same power supply device 402 to receive a charge from the power supply device 402 when a charge pump associated with the phase frequency detector is not charging. For example, the reference capacitor C1 is selectively coupled to the supply voltage via the first switch 404 and the feedback capacitor C2 is selectively coupled to the supply voltage via the second switch 406.

Figure 4B:
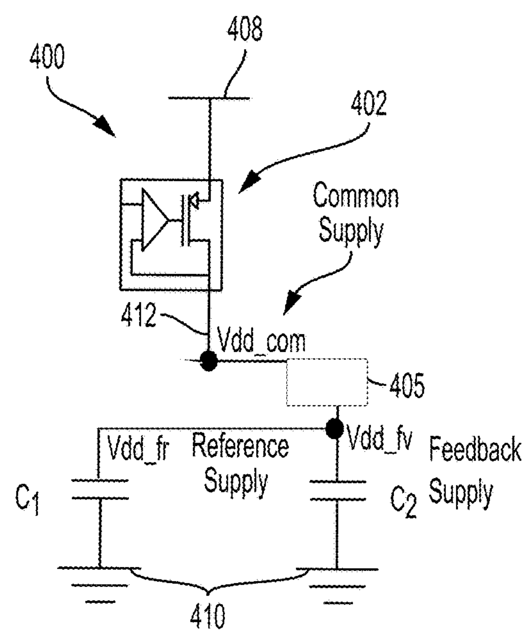
FIG. 4B illustrates another switching power supply for a phase frequency detector (PFD) device of a timing circuit (e.g., phase locked loop) according to aspects of the present disclosure.

FIG. 4B illustrates another switching power supply for the PFD device of a timing circuit according to aspects of the present disclosure. For illustrative purposes, some of the labelling and numbering of the devices and features of FIG. 4A are similar to those of FIG. 4B. However, instead of using the first switch 404 and the second switch 406 illustrated by FIG. 4A, FIG. 4B illustrates a single switch 405 coupled to the reference capacitor C1 and the feedback capacitor C2. For example, the first switch 404 and the second switch 406 of FIG. 4A may be integrated into the single switch 405 of FIG. 4B.

Figure 5:
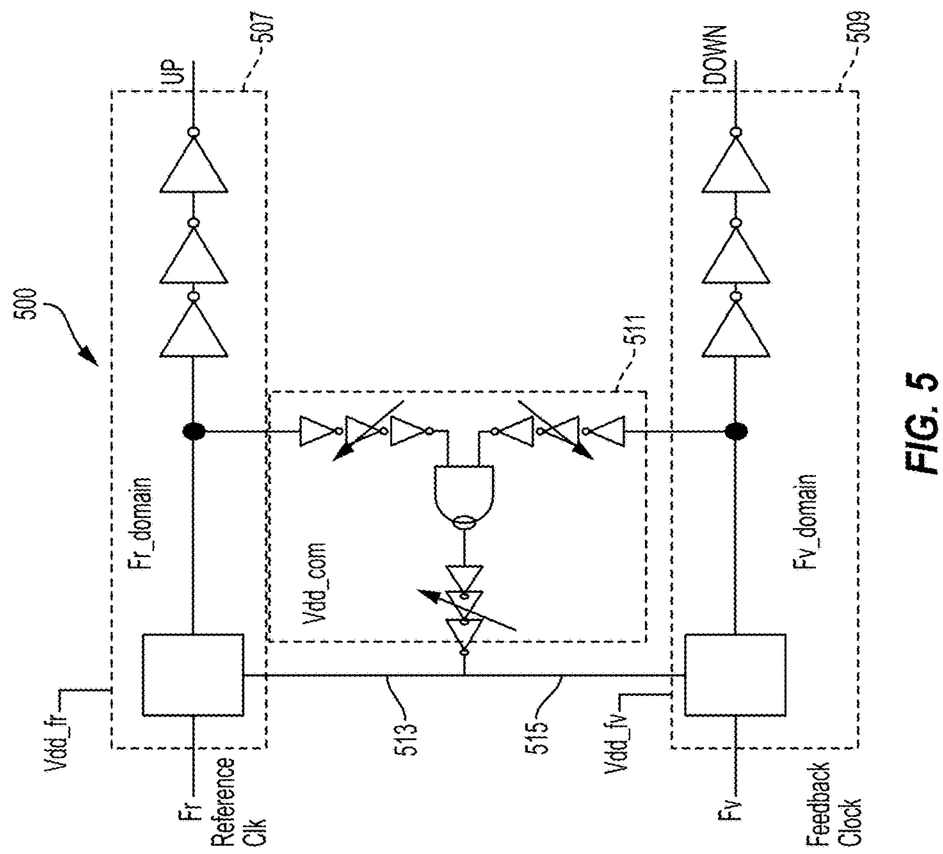
FIG. 5 illustrates a phase frequency detector (PFD) device of a timing circuit (e.g., phase locked loop) according to aspects of the present disclosure.

FIG. 5 is a phase frequency detector (PFD) device 500 of a timing circuit (e.g., phase locked loop), according to aspects of the present disclosure. The PFD device 500 includes a reference domain 507, a feedback domain 509 and a delay circuit 511. For example, the switching power supply 400 is coupled to the PFD device 500 such that the reference capacitor C1 selectively provides a reference supply Vdd_fr to the reference domain 507 of the PFD device 500 and the feedback capacitor C2 provides a feedback supply Vdd_fv to the feedback domain 509 of the PFD device 500. The PFD device 500 detects the difference in phase and frequency between reference signal inputs (Fr) and feedback signal inputs (Fv) and generates an "UP" or "DOWN" control/action signal based on whether the feedback signal input is lagging or leading the reference signal input.

The feedback domain 509 triggers a DOWN (e.g., associated with a falling edge) action signal from charge stored in the feedback capacitor C2 and the reference domain 507 triggers an UP (e.g., associated with a rising edge) action signal from charge stored in the reference capacitor C1. For example, the PFD device 500 includes a feedback domain control unit (not shown) that triggers the DOWN action signal from charge stored in the feedback capacitor C2 and a reference domain control unit (not shown) that triggers the UP action signal from charge stored in the reference capacitor C1. The PFD device 500 may be coupled to a charge pump (not shown) where the DOWN action signal based on the charge stored in the feedback capacitor C2 is provided to the charge pump and the UP action signal based on the charge stored in the reference capacitor C1 is provided to the charge pump.

These "UP" or "DOWN" action signals determine whether a VCO coupled to the PFD device 500 operates at a higher or lower frequency. The PFD outputs these "UP" and "DOWN" action signals to a charge pump (not shown). The delay circuit 511 is coupled to the feedback domain 509 and the reference domain 507 in accordance with a feedback loop configuration to provide delay adjusted signals 513 and 515 to ensure that falling edges of the reference signal input (Fr) and the feedback signal input (Fv) occur at a same time. For example, the delay adjusted signal 513 may be provided to the reference domain 507 while the delay adjusted signal is provided to the feedback domain 509.

Figure 6:
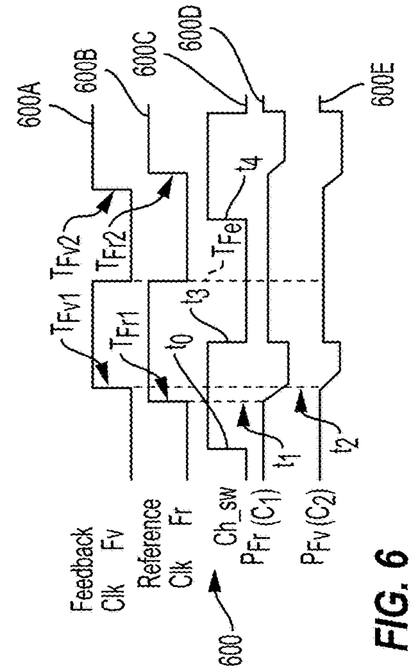
FIG. 6 is a timing diagram showing various output signals of the switching power supply of FIG. 4 according to aspects of the present disclosure.

FIG. 6 is a timing diagram 600 showing various output signals of the switching power supply 400 of FIG. 4A and FIG. 4B, according to aspects of the present disclosure. The timing diagram 600 includes time graphs 600A-600E. The timing graph 600A represents feedback clock signals or feedback signal inputs (Fv) provided to a PFD from an output of a phase locked loop (PLL) including the PFD. The timing graph 600B represents reference clock signals or reference signal inputs (Fr) provided to the PFD from a reference clock. The timing graph 600C represents a control signal (e.g., control signal 414) for enabling the first switch 404 and/or the second switch 406 to provide power supply from the reference capacitor C1 to the reference domain and/or the feedback capacitor C2 to the feedback domain. The timing graph 600D represents charge (e.g., voltage, current or power (PFr)) from the reference capacitor C1 to the reference domain 507 of the PFD device 500. The timing graph 600E represents charge (e.g., voltage, current or power (PFv)) from the feedback capacitor C2 to the feedback domain 509 of the PFD device 500.

Referring to the timing graphs 600A and 600B, TFv1 and TFr1 respectively represent rising edges of the feedback signal input (Fv) and the reference signal input (Fr). The delay circuit 511 ensures that falling edges of the feedback signal input (Fv) and the reference signal input (Fr) occur at a same time TFe. However, the rising edges may occur at different times (e.g., times t1 and t2). PFr and PFv respectively represent power supply (e.g., voltage from capacitors C1 and C2) functions associated with the reference path and the feedback path.

When power is supplied directly from the LDO regulator 402 to each of the reference path and the feedback path (without split supply associated with C1 and C2), at time t1, which corresponds to the rising edge of the reference signal input (Fr), the power supply (e.g., low dropout (LDO) regulator) dips as power is provided for the rising edge of the reference signal input (Fr). Similarly, at time t2, which corresponds to the rising edge of the feedback signal input (Fv), the power supply dips as power is provided for the rising edge of the feedback signal input (Fv). However, in this power supply configuration, at time t2, the power supply from the directly coupled LDO is not at full strength (e.g., below an ideal voltage). As a result, the "UP" or "DOWN" signals at an output of the PFD device 500 corresponding to the feedback signal input (Fv) are further delayed relative to those associated with the reference signal input (Fr). Accordingly, the time difference between the rising edges of the reference and feedback signals cannot be held constant or maintained at the output of the PFD device 500. As a result, the PFD device 500 is subject to non-linearity.

Accordingly, aspects of the present disclosure substantially maintain (or keep substantially constant) a time difference between the respective rising edges TFv1 and TFr1 and their corresponding rising edge outputs of the reference clock and the feedback clock after being processed through the PFD device 500. To maintain the time difference, the switching power supply 400 is coupled to the PFD device 500 to isolate supply (e.g., voltage supply) to the reference path and the feedback path of the PLL such that the power supply to the reference path is independent of the power supply to the feedback path.

For example, an UP or DOWN action signal associated with the feedback capacitor C2 selectively coupled to the common node 412 (that sees the supply voltage from the LDO regulator 402) via the second switch 406 is achieved at the feedback domain 509 of the PFD device 500. Similarly, an UP or DOWN action signal associated with the reference capacitor C1 selectively coupled to the common node 412 via the first switch 404 is achieved at the reference domain 507 of the PFD device 500. The reference capacitor C1 and/or the feedback capacitor C2 receive a charge from the supply voltage (e.g., from the LDO regulator 402) after the UP and DOWN action signal becomes low and before a next rising edge TFv2 and TFr2 of the feedback signal input (Fv) or reference signal input (Fr).

The reference capacitor C1 and the feedback capacitor C2 respectively provide charge to the reference domain 507 and the feedback domain 509 when the reference capacitor C1 and/or the feedback capacitor C2 are not charging. For example, the reference capacitor C1 and the feedback capacitor C2 respectively provide charge to the reference domain 507 and the feedback domain 509 during the time period from $t_0$ to $t_3$. During this time period, the control signal (timing graph 600C) is high. The reference capacitor C1 and the feedback capacitor C2 respectively receive charge from the LDO regulator 402 during the time period from $t_3$ to $t_4$. During this time period, the control signal is low. The timing graph 600D shows that the dip in power ($P_{Fr}$) at time $t_1$ when the rising edge $T_{Fr1}$ is encountered does not affect the power $P_{Fv}$ provided to the feedback domain 509 when the rising edge $T_{Fv1}$ is later encountered. This feature is achieved because of the split supply configuration where the reference capacitor C1 and the feedback capacitor C2 independently provide power to the PFD device 500.

Figure 7:
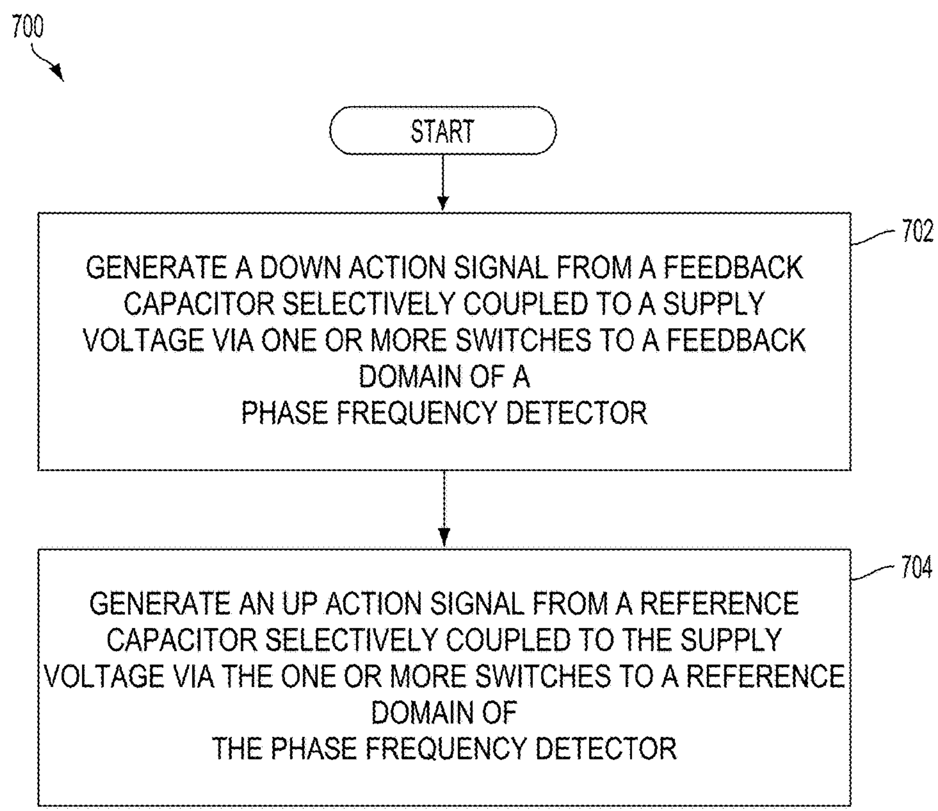
FIG. 7 depicts a simplified flowchart of a method for linearizing a phase frequency detector of a phase locked loop according to aspects of the present disclosure.

FIG. 7 depicts a simplified flowchart 700 of a method for linearizing a phase frequency detector of a phase locked loop. At block 702, a feedback capacitor selectively coupled to a supply voltage via one or more switches generates a DOWN action signal to a feedback domain of the phase frequency detector. At block 704, a reference capacitor selectively coupled to the supply voltage via the one or more switches generates an UP action signal to a reference domain of the phase frequency detector.

According to one aspect of the present disclosure, a phase frequency detector is described. The phase frequency detector includes means for supplying voltage. The phase frequency detector also includes means for selectively coupling a supplied voltage. The voltage supplying means may be, for example, the LDO regulator 402. The selectively coupling means may be, for example, the first switch 404, the second switch 406 and/or the control signal 414. In another aspect, the aforementioned means may be any module or any apparatus or material configured to perform the functions recited by the aforementioned means.

FIG. 8 is a block diagram showing an exemplary wireless communication system in which a configuration of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825B, and 825C that include the disclosed phase frequency detector. It will be recognized that other devices may also include the disclosed phase frequency detector, such as the base stations, switching devices, and network equipment. FIG. 8 shows forward link signals 880 from the base station 840 to the remote units 820, 830, and 850 and reverse link signals 890 from the remote units 820, 830, and 850 to base station 840.

In FIG. 8, remote unit 820 is shown as a mobile telephone, remote unit 830 is shown as a portable computer, and remote unit 850 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the phase frequency detector.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A phase frequency detector, comprising:

a supply voltage;

at least one switch;

a reference domain unit configured to receive a reference signal via a first input of the phase frequency detector;

a feedback domain configured to receive a feedback signal via a second input of the phase frequency detector;

a reference capacitor selectively coupled to the supply voltage via the at least one switch, the reference capacitor configured to provide a reference supply to the reference domain unit; and a feedback capacitor selectively coupled to the supply voltage via the at least one switch, the feedback capacitor configured to provide a feedback supply to the feedback domain unit.

2. The phase frequency detector of claim 1, wherein the feedback domain control unit is configured to trigger a DOWN action from charge stored in the feedback capacitor.

3. The phase frequency detector of claim 1, wherein the reference domain control unit is configured to trigger an UP action from charge stored in the reference capacitor.

4. The phase frequency detector of claim 1, in which the at least one switch comprises a first transistor or first switch coupled between the reference capacitor and the supply voltage and a second transistor or second switch coupled between the feedback capacitor and the supply voltage.

5. The phase frequency detector of claim 1, in which each of the feedback capacitor and the reference capacitor are coupled between the at least one switch and a ground.

6. The phase frequency detector of claim 1, in which the phase frequency detector is coupled to a charge pump where a DOWN action signal based at least in part on a charge stored in the feedback capacitor is provided to the charge pump.

7. The phase frequency detector of claim 1, in which the phase frequency detector is coupled to a charge pump where an UP action signal based at least in part on a charge stored in the reference capacitor is provided to the charge pump.

8. A method for linearizing a phase frequency detector of a phase locked loop comprising:

generating a first UP action signal or a first DOWN action signal to a charge pump from a feedback capacitor selectively coupled to a supply voltage via at least one switch to a feedback domain of the phase frequency detector; and generating a second DOWN action signal or a second UP action signal to the charge pump from a reference capacitor selectively coupled to the supply voltage via the at least one switch to a reference domain of the phase frequency detector.

9. The method of claim 8, further comprising receiving a charge from the supply voltage after the first UP action signal, the second UP action signal, the first DOWN action signal and/or the second DOWN action signal becomes low and before a next rising edge of a feedback signal input from the feedback capacitor and a reference signal input from the reference capacitor.

10. The method of claim 8, further comprising providing a delay adjusted signal to the reference domain to ensure falling edges of a reference signal input and falling edges of a feedback signal input occur at a same time.

11. The method of claim 8, further comprising providing a delay adjusted signal to the feedback domain to ensure falling edges of a reference signal input and falling edges of a feedback signal input occur at a same time.

12. The method of claim 8, further comprising detecting a difference in phase and frequency between a reference signal input and a feedback signal input and generating the first UP action signal, the second UP action signal, the first DOWN action signal and/or the second DOWN action signal based at least in part on whether the feedback signal input is lagging or leading the reference signal input.

13. The method of claim 8, further comprising selectively providing a reference supply to the reference domain based at least in part on charge stored in the reference capacitor.

14. The method of claim 8, further comprising selectively providing a feedback supply to the feedback domain based at least in part on charge stored in the feedback capacitor.

15. A phase frequency detector, comprising:

means for supplying voltage;

means for selectively coupling a supplied voltage;

means for triggering a DOWN action using a feedback signal received via a first input of the phase frequency detector;

means for triggering an UP action using a reference signal received via a second input of the phase frequency detector;

a reference capacitor selectively coupled to the voltage supplying means via the coupling means, the reference capacitor configured to provide a reference supply to the means for triggering an UP action; and a feedback capacitor selectively coupled to the voltage supplying means via the coupling means, the feedback capacitor configured to provide a feedback supply to the means for triggering a DOWN action.

16. The phase frequency detector of claim 15, wherein the means for triggering a DOWN action triggers the DOWN action from charge stored in the feedback capacitor.

17. The phase frequency detector of claim 15, wherein the means for triggering an UP action triggers the UP action from charge stored in the reference capacitor.

18. The phase frequency detector of claim 15, in which each of the feedback capacitor and the reference capacitor are coupled between the coupling means and a ground.

19. The phase frequency detector of claim 15, coupled to a charge pump where a DOWN action signal based at least in part on a charge stored in the feedback capacitor is provided to the charge pump.

20. The phase frequency detector of claim 15, coupled to a charge pump where an UP action signal based at least in part on a charge stored in the reference capacitor is provided to the charge pump.

* * * * *